(12) United States Patent
Hirosawa et al.

(10) Patent No.: US 12,490,557 B2
(45) Date of Patent: Dec. 2, 2025

(54) OPTICAL DEVICE

(71) Applicant: Magnolia White Corporation, Tokyo (JP)

(72) Inventors: Jin Hirosawa, Tokyo (JP); Yoshinori Tanaka, Tokyo (JP); Masanobu Ikeda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 665 days.

(21) Appl. No.: 17/889,403

(22) Filed: Aug. 17, 2022

(65) Prior Publication Data
US 2023/0056073 A1    Feb. 23, 2023

(30) Foreign Application Priority Data

Aug. 19, 2021 (JP) ................. 2021-134025

(51) Int. Cl.
*H10H 20/855* (2025.01)
*G02B 3/00* (2006.01)
*H01L 25/16* (2023.01)

(52) U.S. Cl.
CPC ......... *H10H 20/855* (2025.01); *G02B 3/0037* (2013.01); *H01L 25/167* (2013.01)

(58) Field of Classification Search
None
See application file for complete search history.

(56) References Cited

U.S. PATENT DOCUMENTS

| | | | | |
|---|---|---|---|---|
| 2004/0041521 A1* | 3/2004 | Mandler | ............... | H10H 29/142 257/E25.02 |
| 2011/0044022 A1* | 2/2011 | Ko | ............... | G02B 19/0028 313/501 |
| 2013/0170203 A1* | 7/2013 | Cheng | ............... | F21V 5/007 362/235 |
| 2015/0187857 A1* | 7/2015 | Negishi | ............... | H10K 59/8792 257/40 |
| 2018/0090058 A1 | 3/2018 | Chen et al. | | |
| 2020/0381411 A1 | 12/2020 | van den Hoek et al. | | |
| 2021/0193889 A1 | 6/2021 | Kim | | |
| 2022/0238599 A1 | 7/2022 | Yamada | | |
| 2022/0238769 A1* | 7/2022 | Ling | ............... | H01L 25/0753 |

FOREIGN PATENT DOCUMENTS

| | | | | |
|---|---|---|---|---|
| CN | 114791683 B | * | 12/2023 | ........... G02F 1/1336 |
| JP | 2021-67763 A | | 4/2021 | |

OTHER PUBLICATIONS

Office Action issued Apr. 1, 2025, in German Patent Application No. 10 2022 208 552.3, 11pp.

* cited by examiner

*Primary Examiner* — Bo B Jang
(74) *Attorney, Agent, or Firm* — XSENSUS LLP

(57) ABSTRACT

According to one embodiment, an optical device includes a first light-emitting element and a second light-emitting element, a light-shielding layer disposed to overlap a gap between the first light-emitting element and the second light-emitting element and including a first opening overlapping the first light-emitting element and a second opening overlapping the second light-emitting element, an overcoat layer covering the light-shielding layer, a first micro-lens disposed on the overcoat layer and overlapping the first opening and a second micro-lens disposed on the overcoat layer and overlapping the second opening, and an edge of each of the first micro-lens and the second micro-lens overlaps the light-shielding layer.

19 Claims, 13 Drawing Sheets

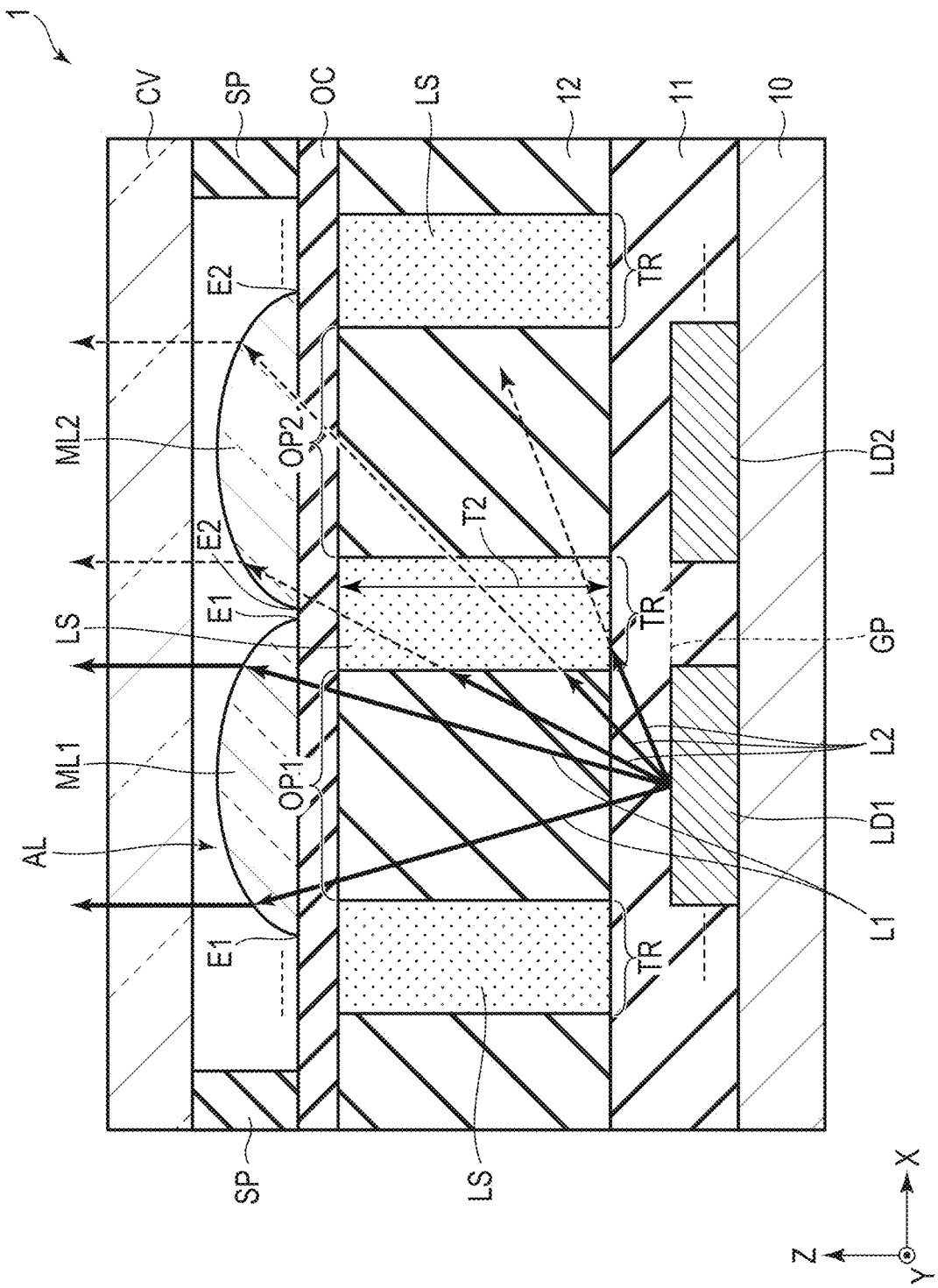
F I G. 3

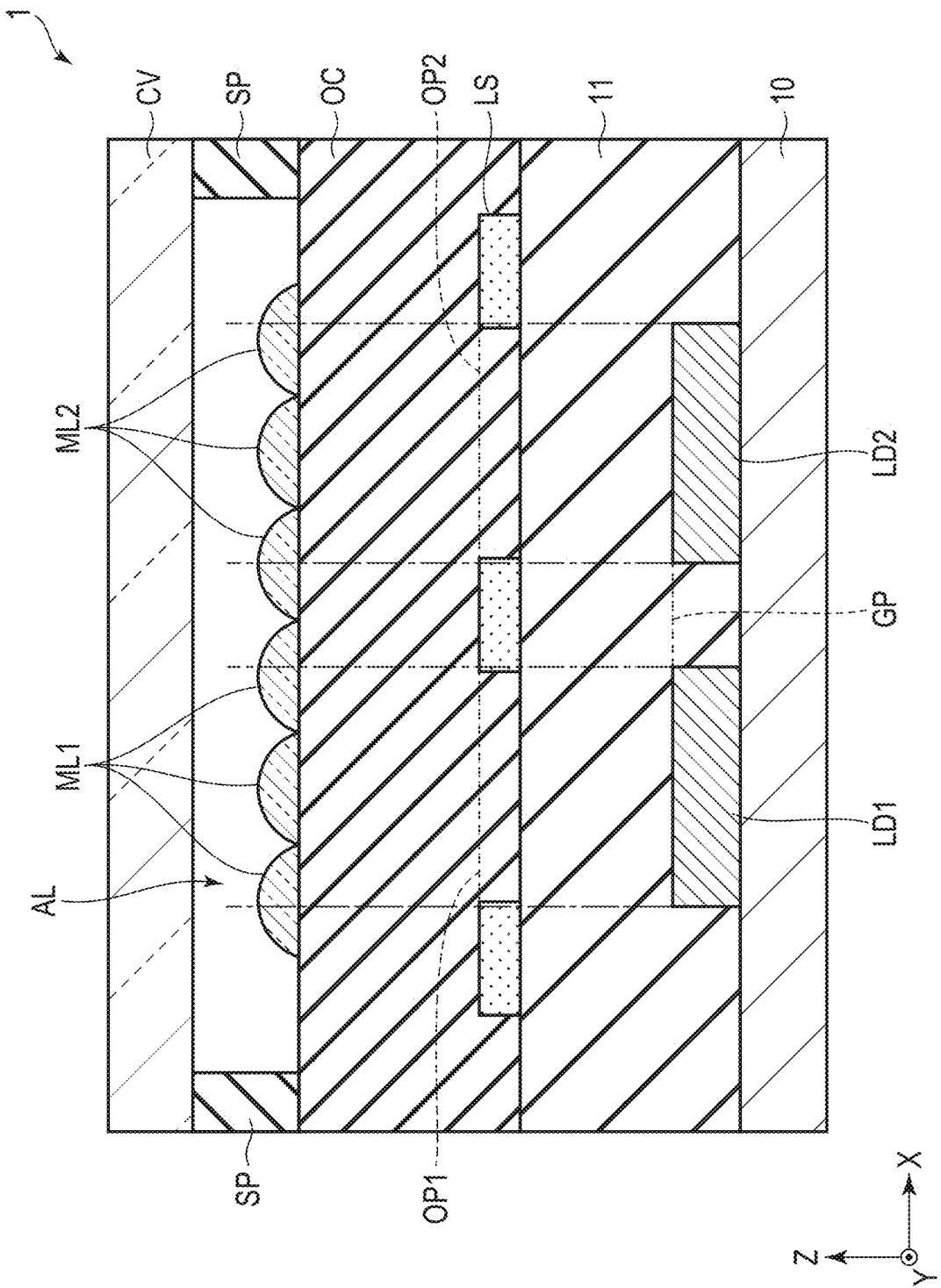
F I G. 5

OPTICAL DEVICE

CROSS-REFERENCE TO RELATED APPLICATIONS

This application is based upon and claims the benefit of priority from Japanese Patent Application No. 2021-134025 filed Aug. 19, 2021, the entire contents of which are incorporated herein by reference.

FIELD

Embodiments described herein relate generally to an optical device.

BACKGROUND

In recent years, various types of display devices which use light-emitting diodes (LEDs) have been proposed. For example, such technology is known that pixels are constituted by micro-LEDs emitting red, green and blue light, respectively and the micro-LEDs are covered with a transparent resin, so as to prevent falling off and the like of the micro-LEDs.

Part of light emitted from such micro-LEDs is totally reflected by the interface between the display device and the air and does not contribute to the displaying. Therefore, there is a demand of improving the efficiency of extraction of emitting light.

BRIEF DESCRIPTION OF THE DRAWINGS

FIG. 3 is a cross-sectional view showing another configuration example of the optical device 1 shown in FIG. 1.

FIG. 5 is a cross-sectional view showing still another configuration example of the optical device 1 shown in FIG. 1.

DETAILED DESCRIPTION

Figure 1:
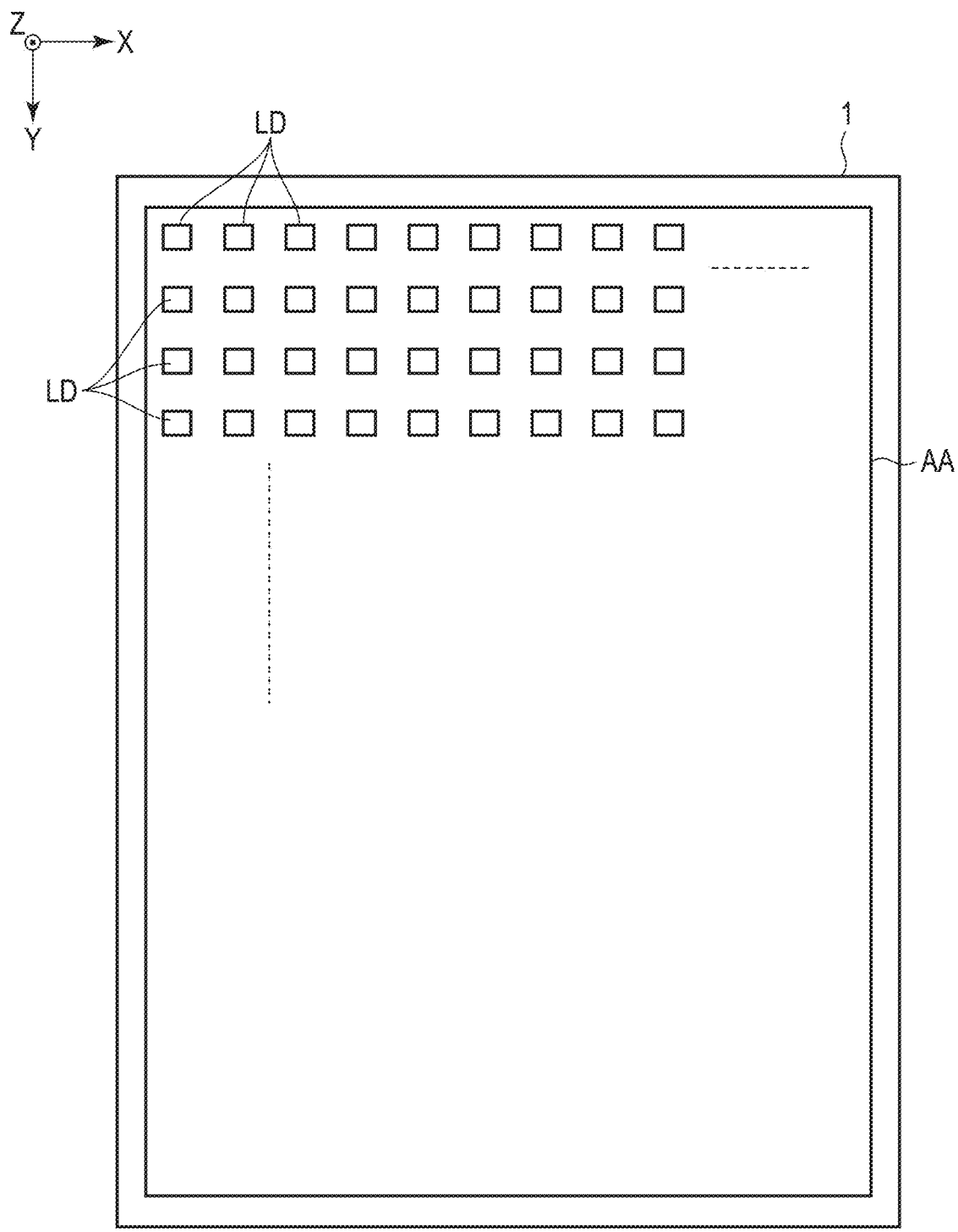
FIG. 1 is a diagram showing an optical device 1 of an embodiment.

In general, according to one embodiment, an optical device comprises a drive circuit board, a first light-emitting element and a second light-emitting element mounted on the drive circuit board, a first insulating film covering the first light-emitting element and the second light-emitting element, a light-shielding layer disposed to overlap a gap between the first light-emitting element and the second light-emitting element on the first insulating film, and including a first opening overlapping the first light-emitting element and a second opening overlapping the second light-emitting element, an overcoat layer covering the light-shielding layer, a first micro-lens disposed on the overcoat layer and overlapping the first opening and a second micro-lens disposed on the overcoat layer and overlapping the second opening. An edge of each of the first micro-lens and the second micro-lens overlaps the light-shielding layer.

According to another embodiment, an optical device comprises a drive circuit board, a first light-emitting element and a second light-emitting element mounted on the drive circuit board, a first insulating film covering the first light-emitting element and the second light-emitting element, a first insulating film covering the first light-emitting element and the second light-emitting element, a light-shielding layer disposed to overlap a gap between the first light-emitting element and the second light-emitting element on the first insulating film and including a first opening overlapping the first light-emitting element and a second opening overlapping the second light-emitting element, an overcoat layer covering the light-shielding layer, a plurality of first micro-lenses disposed on the overcoat layer and overlapping the first opening and a plurality of second micro-lenses disposed on the overcoat layer and overlapping the second opening.

According to another embodiment, an optical device comprises a drive circuit board, a first light-emitting element and a second light-emitting element mounted on the drive circuit board, a first insulating film covering the first and second light-emitting elements, a light-shielding layer disposed to overlap a gap between the first light-emitting element and the second light-emitting element on the first insulating film, and including a first opening overlapping the first light-emitting element and a second opening overlapping the second light-emitting element, an overcoat layer covering the light-shielding layer and a single micro-lens disposed on the overcoat layer and overlapping over the first opening and the second opening.

According to an embodiment, it is possible to provide an optical device which can improve the efficiency of light extraction.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

In this embodiment, a first direction X, a second direction Y and a third direction Z are defined as shown in drawings. The first direction X, the second direction Y and the third direction Z are orthogonal to each other, but they may intersect at an angle other than 90 degrees. In the following descriptions, viewing on an X-Y plane defined by the first direction X and the second direction Y is referred to as a planar view.

FIG. 1 shows an optical device 1 of this embodiment.

The optical device 1 comprises a plurality of light-emitting elements LD arranged in an active area AA. The light-emitting elements LDs are arranged in a matrix in the first direction X and the second direction Y. The light-emitting elements LD adjacent along the first direction X are spaced apart from each other. The light-emitting elements LD adjacent along the second direction Y are spaced apart from each other.

For example, when the optical device 1 is an illumination device such as a backlight device, the active area AA forms an illumination area which illuminate objects. Further, if the optical device 1 is a display device, the active area AA forms a display area which displays images.

The light-emitting elements LD applied in this embodiment are light-emitting diodes (LEDs) of extremely small size. Each of the light-emitting elements LD is a micro-LED having sides each having, for example, 1 μm or more but 300 μm or less.

First, some configuration examples of the cross-sectional structure of the optical device 1 will be described. Note that in each of the following configuration examples, among the light-emitting elements LD arranged in the active area AA, the structure of the main part will be explained with reference to the cross-sectional view of the region including a first light-emitting element LD1 and a second light-emitting element LD2 arranged along the first direction X.

Figure 2:
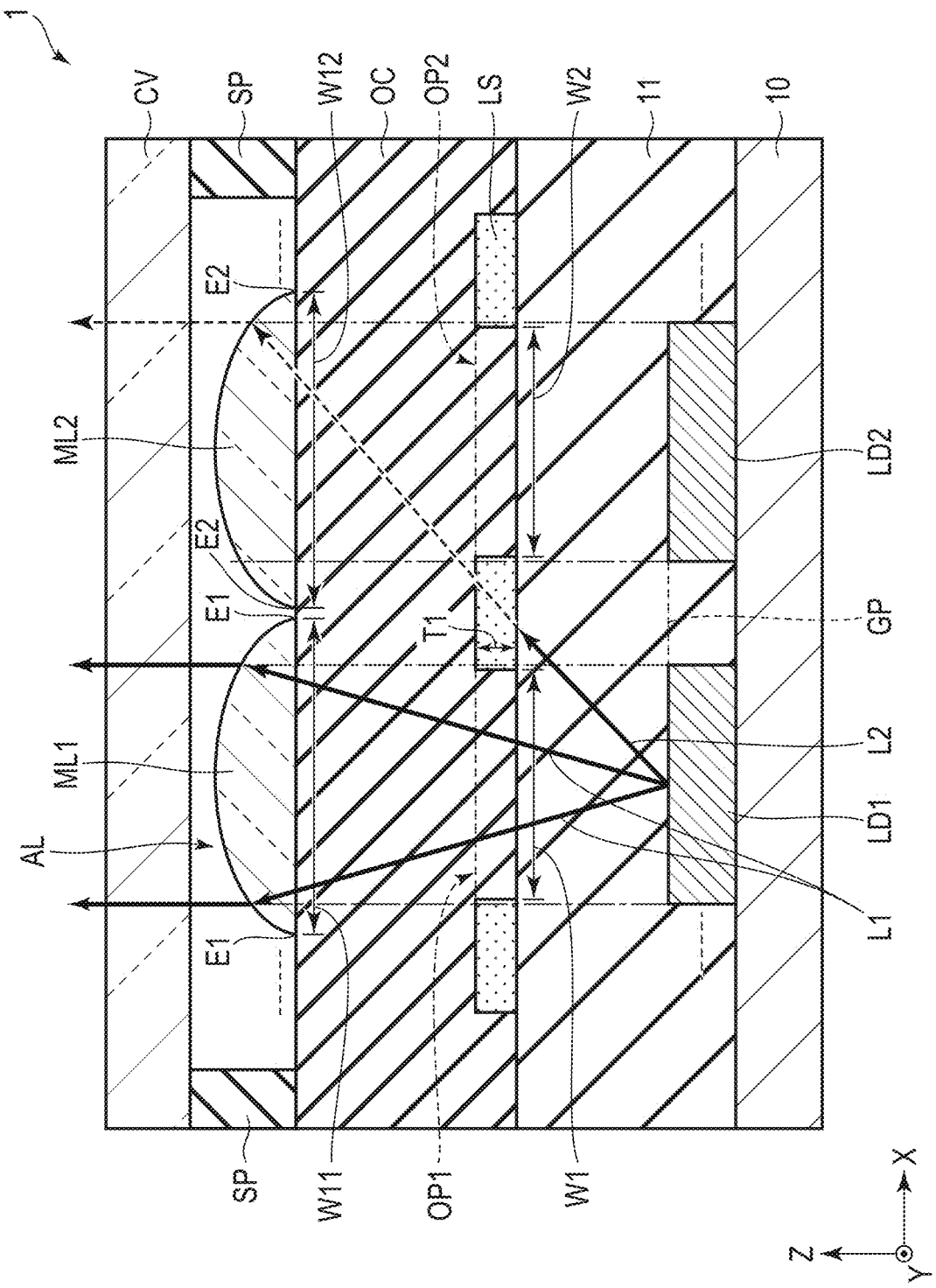
FIG. 2 is a cross-sectional view showing a configuration example of the optical device 1 shown in FIG. 1.

FIG. 2 is a cross-sectional view showing one configuration example of the optical device 1 shown in FIG. 1.

The optical device 1 comprises a drive circuit board 10, the first light-emitting element LD1, the second light-emitting element LD2, a first insulating film 11, a light-shielding layer LS, an overcoat layer OC, a first micro-lens ML1, a second micro-lens ML2, a spacer SP and a cover member CV.

The drive circuit board 10 comprises a drive circuit, various wiring lines and various insulating films on a base layer such as a glass substrate or a resin substrate, for example. The first light-emitting element LD1 and the second light-emitting element LD2 are mounted on the drive circuit board 10. For example, each of the first light-emitting element LD1 and the second light-emitting element LD2 is connected by solder to a respective pad provided on the drive circuit board 10. The first light-emitting element LD1 and the second light-emitting element LD2 may be configured to emit light of the same color or configured to emit light of colors different from each other.

The first insulating film 11 covers the drive circuit board 10, the first light-emitting element LD1 and the second light-emitting element LD2. The first insulating film 11 is, for example, a transparent organic film, but it may as well be a transparent inorganic film or a multilayer film of an organic film and an inorganic film.

The light-shielding layer LS is disposed on the first insulating film 11 so as to overlap a gap GP between the first light-emitting element LD1 and the second light-emitting element LD2. Further, although not illustrated here, the light-shielding layer LS is located to overlap gaps each between other each adjacent pair of light-emitting elements LD. At the same time, the light-shielding layer LS includes a first opening OP1 overlapping the first light-emitting element LD1 and a second opening OP2 overlapping the second light-emitting element LD2.

In the example shown in FIG. 2, between the first insulating film 11 and the overcoat layer OC, one single light-shielding layer LS is disposed, and this light-shielding layer LS is in contact with the first insulating film 11. The light-shielding layer LS is, for example, an organic layer containing black pigments, but it may as well be a metal layer. The light-shielding layer LS has a film thickness T1 along the third direction Z, which is, for example, 5 μm or less.

The overcoat layer OC directly covers the first insulating film 11 and the light-shielding layer LS. In other words, the light-shielding layer LS is in contact with the overcoat layer OC. In the first opening OP1 and the second opening OP2, the first insulating film 11 is in contact with the overcoat layer OC. The overcoat layer OC is a transparent organic film, but may be a multilayer film of an organic film and an inorganic film.

On the overcoat layer OC, the first micro-lens ML1 and the second micro-lens ML2 are disposed. The first micro-lens ML1 overlaps the first opening OP1 and is located directly above the first light-emitting element LD1. The second micro-lens ML2 overlaps the second opening OP2 and is located directly above the second light-emitting element LD2.

The first micro-lens ML1 has a width W11 greater than a width W1 of the first opening OP1, and the second micro-lens ML2 has a width W12 greater than a width W2 of the second opening OP2. The widths here are each a length along the first direction X. Further, the first micro-lens ML1 has an edge E1, the second micro-lens ML2 has an edge E2, and the edge E1 and the edge E2 overlap the light-shielding layer LS.

The spacer SP is disposed on the overcoat layer OC. The spacer SP is located on an outer side of the active area, for example.

The cover member CV is supported by the spacer SP, and opposes the first micro-lens ML1 and the second micro-lens ML2 in the third direction Z. Between the cover member CV and the first micro-lens ML1, a low refractive index layer AL having a refractive index lower than that of the first micro-lens ML1 is interposed. The low refractive index layer AL is interposed between the cover member CV and the second micro-lens ML2 as well. The low refractive index layer AL is, for example, an air layer. The cover member CV is a transparent glass substrate or a transparent resin substrate.

Here, an optical path of light emitted from the first light-emitting element LD1 will now be described.

Of the light emitted from the first light-emitting element LD1, light L1 passes through the first insulating film 11 and then through the first opening OP1, and passes through the overcoat layer OC to enter the first micro-lens ML1. In an interface between the first micro-lens ML1 and the low refractive index layer AL, the light L1 is refracted and proceeds along the third direction Z (or a normal direction of the optical device 1). In other words, the light L1 transmitted through the first micro-lens ML1 enters the cover member CV substantially perpendicularly. The light L1 entering the cover member CV passes through the cover member CV without substantially being totally reflected.

With this structure, the efficiency of light extraction can be improved as compared to the case where the first micro-lens ML1 is not provided. Further, the luminance along the normal direction of the optical device 1 can be improved.

On the other hand, of the light emitted from the first light-emitting element LD1, light L2 which spreads outward from the first opening OP1, will now be focused. If the light-shielding layer LS is not provided, the light L2 enters the second micro-lens ML2 and passes through the cover member CV as shown by a dotted arrow. This means that the light L2 emitted from the first light-emitting elements LD1 is extracted out to the outside directly above those of the second light-emitting elements LD2 which are not lit. In other words, the light L2 is undesired leaking light, which is one of the factors causing reduction in definition.

In this embodiment, the light L2 is blocked by the light-shielding layer LS, and the entering thereof into the second micro-lens ML2 is suppressed. Thus, the reduction in the degree of definition can be suppressed.

In the first configuration example described above, the first insulating film 11, the overcoat layer OC, the first micro-lens ML1, and the second micro-lens ML2 should preferably have refractive indices equivalent to each other (or minute differences in refractive indices) in terms of suppressing undesired refraction and reflection in their respective interfaces.

Next, other configuration examples will be described.

FIG. 3 is a cross-sectional view of another configuration example of the optical device 1 shown in FIG. 1.

The configuration example shown in FIG. 3 is different from that of FIG. 2 in that the light-shielding layer LS is formed into the form of a wall overlapping the gap GP between the first light-emitting element LD1 and the second light-emitting element LD2. Further, the optical device 1 comprises a second insulating film 12 between the first insulating film 11 and the overcoat layer OC.

The second insulating film 12 is disposed on the first insulating film 11. The second insulating film 12 is, for example, a transparent organic film, but it may as well be a transparent inorganic film or a multilayer film of an organic film and an inorganic film. In the second insulating film 12, a trench TR is formed to penetrate to the first insulating film 11. The trench TR overlaps the gap GP between each adjacent pair of light-emitting elements LD. Note that it is not essential that the trench TR penetrates to the insulating film 11.

The light-shielding layer LS is located on the first insulating film 11 to overlap the gap GP between the first light-emitting elements LD1 and the second light-emitting elements LD2, and is disposed in the trench TR. Note that the light-shielding layers LS are located in other trenches TR as well. In the example shown in FIG. 3, the light-shielding layer LS is in contact with the first insulating film 11. The light-shielding layer LS is, for example, an organic layer containing black pigments, and has a film thickness T2 equivalent to the thickness of the second insulating film 12 along the third direction Z. The film thickness T2 is, for example, 10 μm or more.

On the other hand, the light-shielding layer LS includes a first opening OP1 overlapping the first light-emitting element LD1 and a second opening OP2 overlapping the second light-emitting element LD2.

The overcoat layer OC directly covers the second insulating film 12 and the light-shielding layer LS. In other words, the light-shielding layer LS is in contact with the overcoat layer OC. In the first opening OP1 and the second opening OP2, the second insulating film 12 is in contact with the overcoat layer OC. Note that the overcoat layer OC may be integrated with the second insulating film 12 as one body.

The first micro-lens ML1 and the second micro-lens ML2 are disposed on the overcoat layer OC. The first micro-lens ML1 overlaps the first opening OP1 and is located directly above the first light-emitting element LD1. The second micro-lens ML2 overlaps the second opening OP2 and is located directly above the second light-emitting element LD2. The edge E1 of the first micro-lens ML1 and the edge E2 of the second micro-lens overlap the light-shielding layer LS.

Here, the optical path of light emitted from the first light-emitting element LD1 will now be described. Of the light emitted from the first light-emitting element LD1, the light L1 passes through the first insulating film 11 and through the first opening OP1, and passes through the overcoat layer OC to enter the first micro-lens ML1. In the interface between the first micro-lens ML1 and the low refractive index layer AL, the light L1 is refracted and proceeds along the third direction Z (or the normal direction of the optical device 1) and enters substantially perpendicularly to the cover member CV. The light L1 entering the cover member CV is transmitted through the cover member CV without being substantially totally reflected.

On the other hand, of the light emitted from the first light-emitting element LD1, the light L2 that spreads outward from the first opening OP1 is blocked by the light-shielding layer LS, and the entering thereon into the second micro-lens ML2 or other micro-lenses can be suppressed.

Therefore, advantageous effects similar to those described with reference to FIG. 2 can be obtained.

Figure 4:
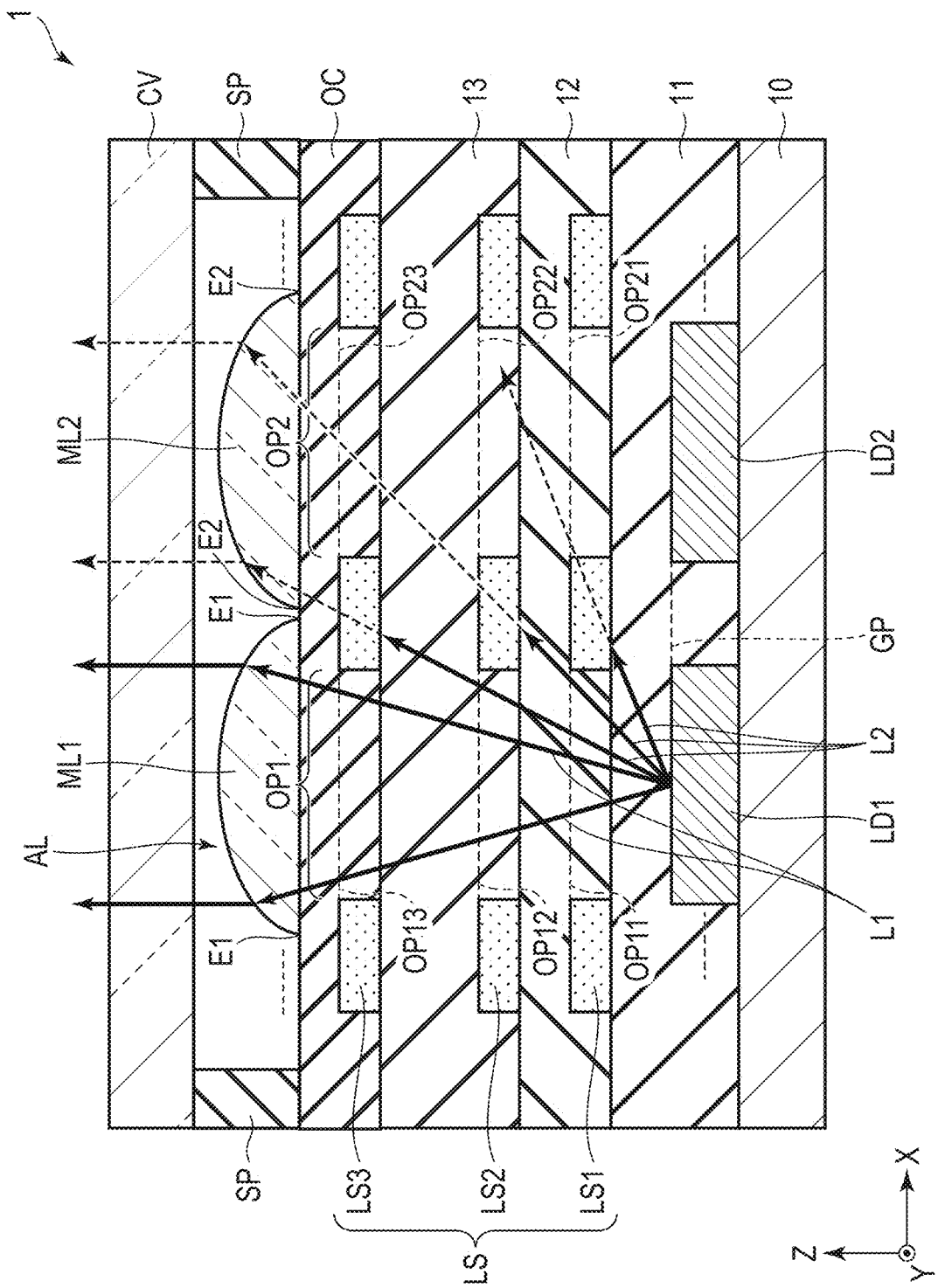
FIG. 4 is a cross-sectional view showing still another configuration example of the optical device 1 shown in FIG. 1.

FIG. 4 is a cross-sectional view showing another configuration example of the optical device 1 shown in FIG. 1.

The configuration example shown in FIG. 4 is different from that of FIG. 2 in that the light-shielding layer LS includes multiple layers. For example, the light-shielding layer LS includes a first layer LS1, a second layer LS2 and a third layer LS3 between the first insulating film 11 and the overcoat layer OC. The light-shielding layer LS may include four or more layers.

Further, the optical device 1 comprises a second insulating film 12 and a third insulating film 13 between the first insulating film 11 and the overcoat layer OC. The second insulating film 12 and the third insulating film 13 are, for example, transparent organic films, but they may as well be transparent inorganic films or multilayers each including an organic film and an inorganic film.

The first layer LS1 is disposed on the first insulating film 11. The second insulating film 12 covers the first insulating film 11 and the first layer LS1. In other words, the first layer LS1 is in contact with the first insulating film 11 and the second insulating film 12. The first layer LS1 includes an opening OP11 overlapping the first light-emitting element LD1 and an opening OP21 overlapping the second light-emitting element LD2.

The second layer LS2 is disposed on the second insulating film 12. The third insulating film 13 covers the second insulating film 12 and the second layer LS2. In other words, the second layer LS2 is in contact with the second insulating film 12 and the third insulating film 13. The second layer LS2 includes an opening OP12 overlapping the first light-emitting element LD1 and an opening OP22 overlapping the second light-emitting element LD2.

The third layer LS3 is disposed on the third insulating film 13. The overcoat layer OC covers the third insulating film 13 and the third layer LS3. In other words, the third layer LS3 is in contact with the third insulating film 13 and the overcoat layer OC. The third layer LS3 includes an opening OP13 overlapping the first light-emitting element LD1 and an opening OP23 overlapping the second light-emitting element LD2.

The openings OP11 to OP13 overlap each other along the third direction Z to constitute the first opening OP1. The openings OP21 to OP23 overlap each other along the third direction Z to constitute the second opening OP2.

The first micro-lens ML1 and the second micro-lens ML2 are disposed on the overcoat layer OC. The first micro-lens ML1 overlaps the first opening OP1 and is located directly above the first light-emitting element LD1. The second micro-lens ML2 overlaps the second opening OP2 and is located directly above the second light-emitting element LD2. The edge E1 of the first micro-lens ML1 and the edge E2 of the second micro-lens Edge E2 overlap the light-shielding layer LS.

In such a configuration example as well, the light L1 enters substantially perpendicularly to the cover member CV and passes through the cover member CV. On the other hand, the light L2 is blocked by the first layer LS1, the second layer LS2 and the third layer LS3 of the light-shielding layer LS.

Therefore, advantageous effects similar to those described with reference to FIG. 2 can be obtained.

FIG. 5 is a cross-sectional view of another configuration example of the optical device 1 shown in FIG. 1.

The configuration example shown in FIG. 5 is different from that of FIG. 2 in that a plurality of micro-lenses overlap one light-emitting element LD. More specifically, a plurality of first micro-lenses ML1 overlap the first opening OP1 and are located directly above the first light-emitting element LD1. Further, a plurality of second micro-lenses ML2 overlap the second opening OP2 and are located directly above the second light-emitting element LD2. The light-shielding layer LS is disposed to overlap a gap GP between the first light-emitting element LD1 and the second light-emitting element LD2.

In such a configuration example as well, advantageous effects similar to those described with reference to FIG. 2 can be obtained.

Figure 6:
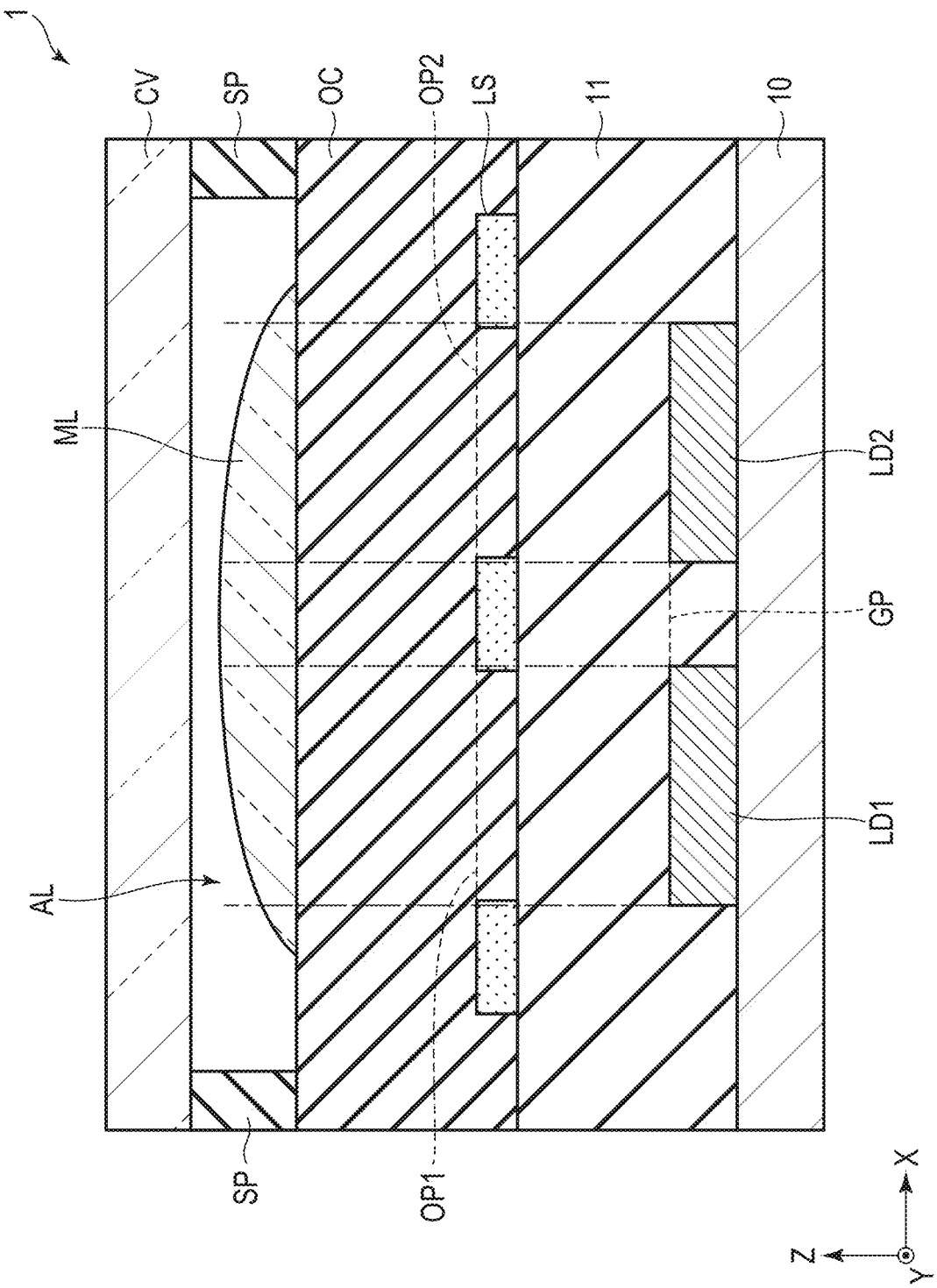
FIG. 6 is a cross-sectional view showing still another configuration example of the optical device 1 shown in FIG. 1.

FIG. 6 is a cross-sectional view of another configuration example of the optical device 1 shown in FIG. 1.

The configuration example shown in FIG. 6 is different from that of FIG. 2 in that one micro-lens ML overlaps a plurality of light-emitting elements LD. In other words, a single micro-lens ML overlaps the first opening OP1 and the second opening OP2 thereover, and is located directly above the first light-emitting element LD1 and the second light-emitting element LD2. The light-shielding layer LS is disposed to overlap a gap GP between the first light-emitting element LD1 and the second light-emitting element LD2.

In such a configuration example as well, advantageous effects similar to those described with reference to FIG. 2 can be obtained.

Next, some configuration examples of the planar structure of the optical device 1 will be described. In each of the following configuration examples, the structure of the main part will be explained with reference to the plan view of the area containing six light-emitting elements LD arranged along the first direction X and the second direction Y of the light-emitting elements LDs arranged in the active area AA. Note that the six light-emitting elements LD include the first light-emitting element LD1 and the second light-emitting element LD2 discussed above.

Figure 7:
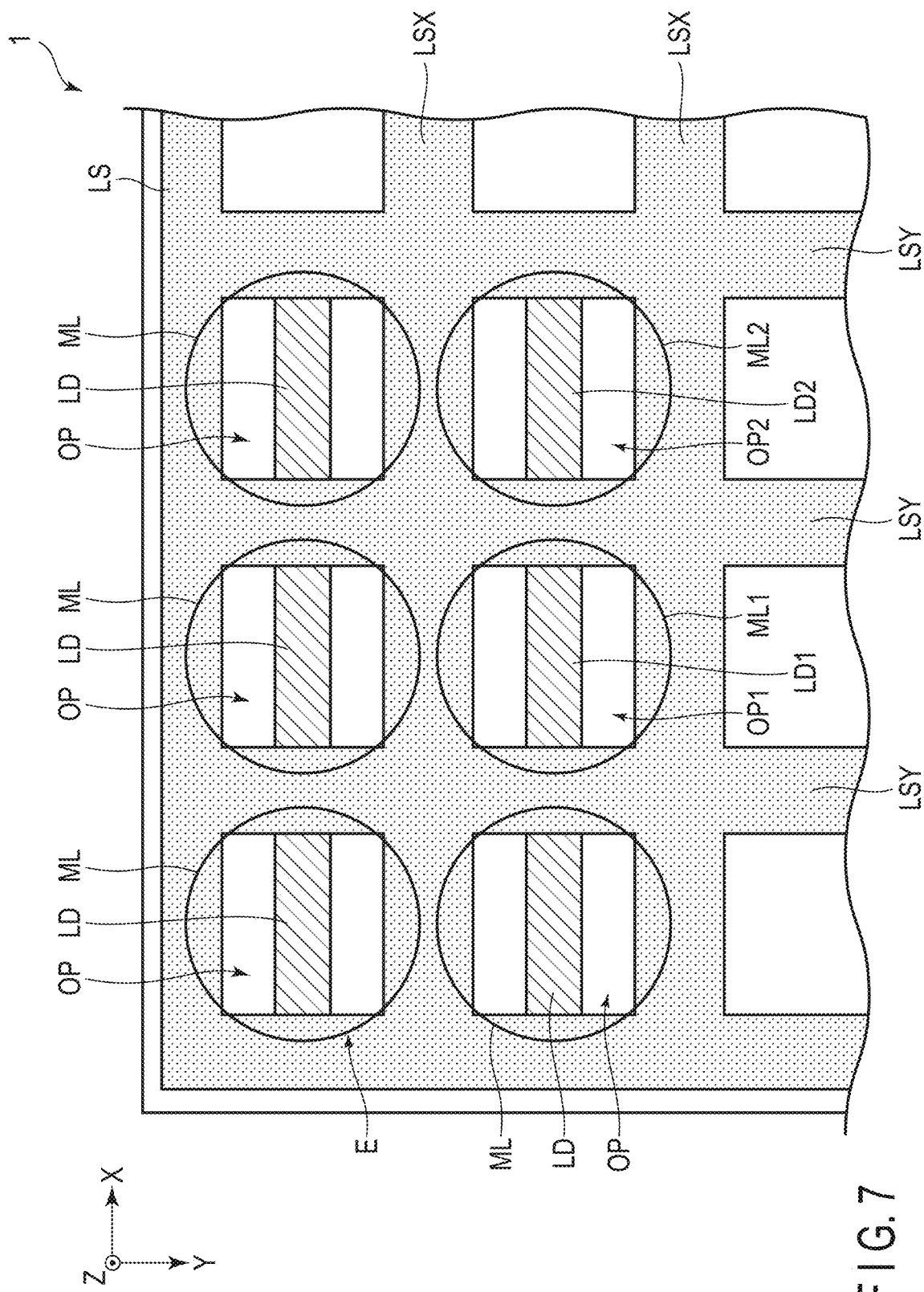
FIG. 7 is a plan view showing a configuration example of the optical device 1 shown in FIG. 1.

FIG. 7 is a plan view showing a configuration example of the optical device 1 shown in FIG. 1.

A plurality of light-emitting elements including the first light-emitting element LD1 and the second light-emitting element LD2 LDs are arranged in a matrix along the first direction X and the second direction Y.

The light-shielding layer LS is formed into a lattice shape, in plan view, a portion LSX extending along the first direction X and a portion LSY extending along the second direction Y. The portion LSX overlaps between adjacent light-emitting elements LD arranged along the second direction Y. The portion LSY overlaps between adjacent light-emitting elements LD arranged along the first direction X.

A plurality of openings including the first opening OP1 and the second opening OP2 overlap the light-emitting elements LD, respectively, in plan view, and are all formed into a quadrangular shape. The openings OP are not limited to the quadrangular shape, but may be formed into other polygonal shapes.

A plurality of micro-lenses ML including the first micro-lens ML1 and the second micro-lens ML2 are arranged in a matrix along the first direction X and the second direction Y, and in plan view, they respectively overlap the openings OP and the light-emitting elements LD. Each of the micro-lenses ML includes a circular edge E in plan view. Substantially the entire edge E overlaps the light-shielding layer LS.

Figure 8:
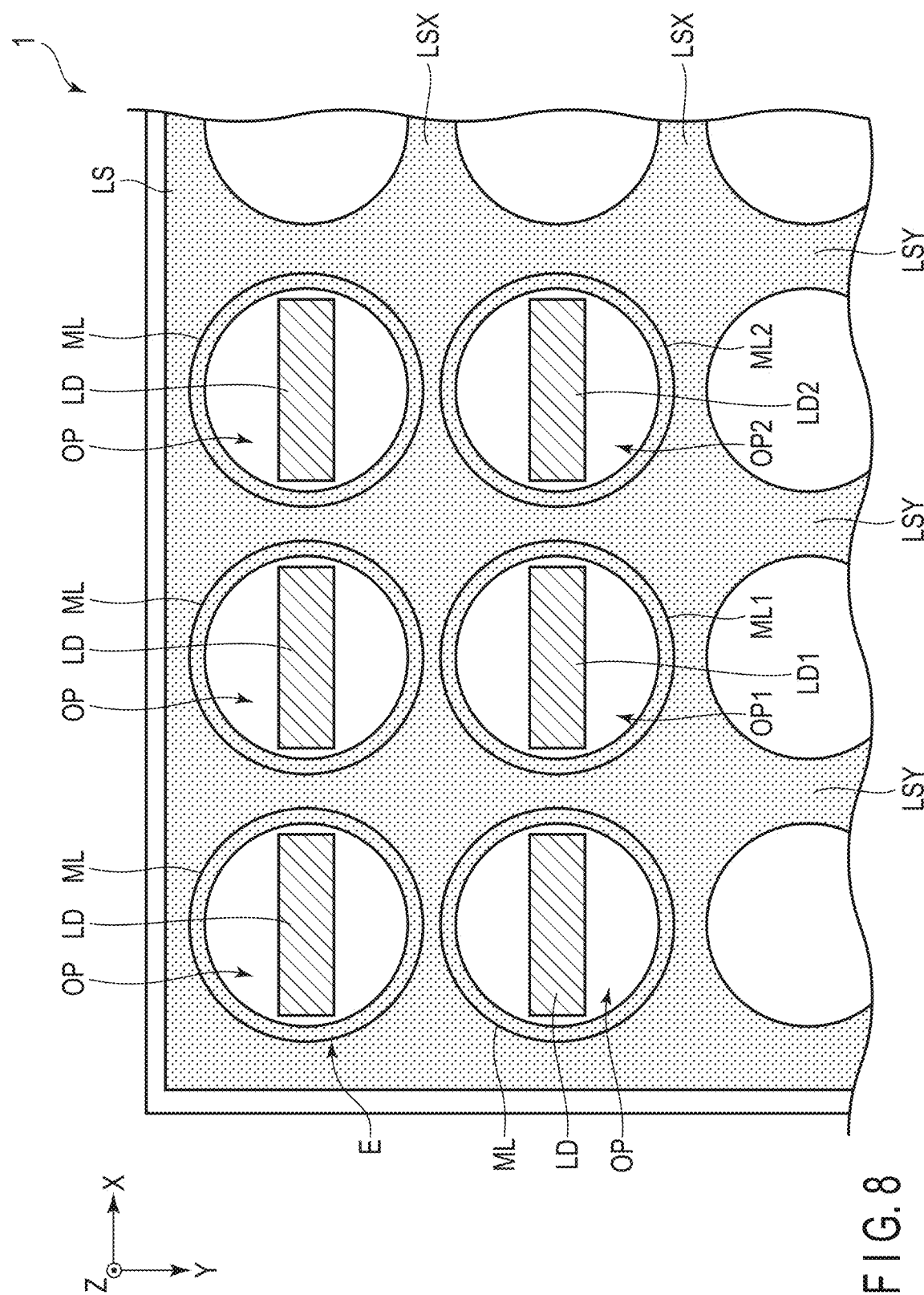
FIG. 8 is a plan view showing another configuration example of the optical device 1 shown in FIG. 1.

FIG. 8 is a plan view of another configuration example of the optical device 1 shown in FIG. 1.

The configuration example shown in FIG. 8 is different from that of FIG. 7 in that the openings OP including the first opening OP1 and the second opening OP2 are all formed in a circular shape.

The light-shielding layer LS is formed into a lattice shape including a portion LSX and a portion LSY in plan view, and overlaps between adjacent light-emitting elements LD. The openings OP overlap the light-emitting elements LD, respectively, in plan view. Note that the openings OP are not limited to a circular shape, but may as well be formed into an elliptical shape.

The micro-lenses ML overlap the openings OP and the light-emitting elements LD, respectively, in plan view. Each of the micro-lenses ML includes a circular edge E in plan view. Substantially the entire edge E overlaps the light-shielding layer LS.

In each of the configuration examples shown in FIGS. 7 and 8, the light-shielding layer LS may be formed of an insulating material or a conductive material.

Figure 9:
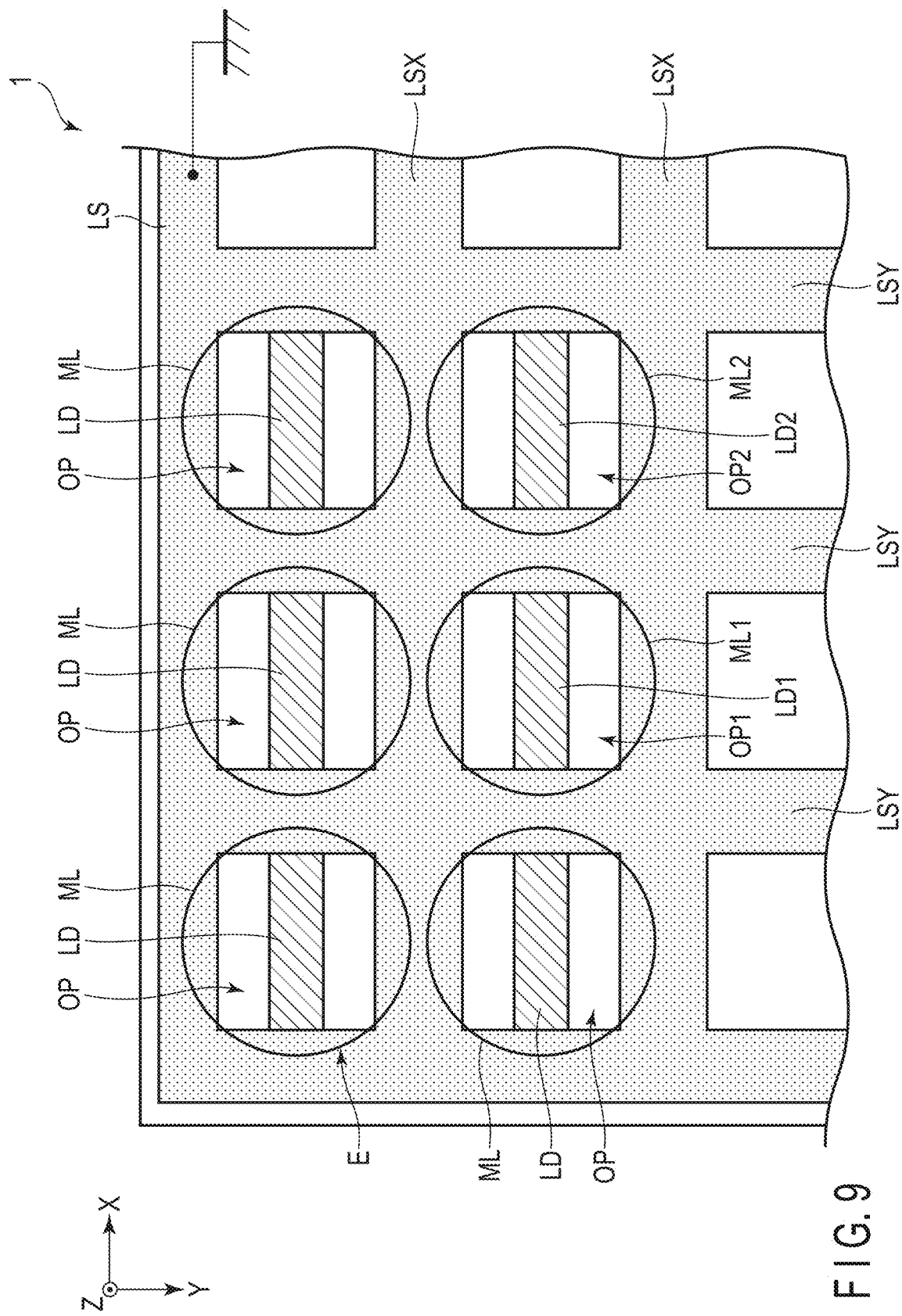
FIG. 9 is a plan view showing still another configuration example of the optical device 1 shown in FIG. 1.

FIG. 9 is a plan view of another configuration example of the optical device 1 shown in FIG. 1.

In the configuration example shown in FIG. 9, the light-shielding layer LS is formed of a conductive material and is grounded.

According to such a configuration example, accumulation of undesired charge in the optical device 1 can be suppressed.

Further, the light-shielding layer LS can diffuse the heat generated by the light emission of the light-emitting elements LD.

Figure 10:
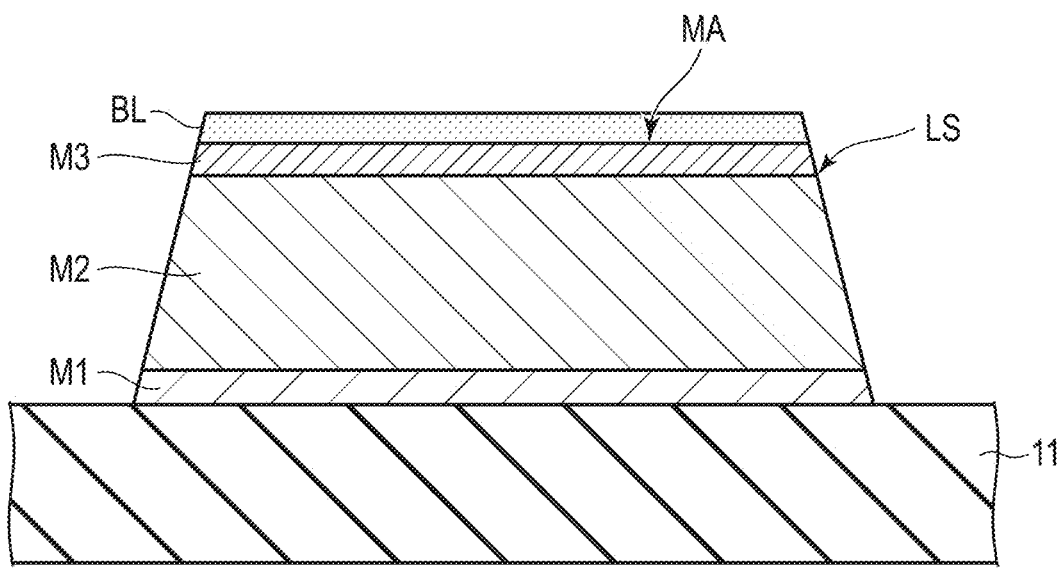
FIG. 10 is a cross-sectional view showing an example of a light-shielding layer LS shown in FIG. 9.

FIG. 10 is a cross-sectional view showing an example of the light-shielding layer LS shown in FIG. 9.

The light-shielding layer LS includes metal layers M1 to M3 and a light-absorbing layer BL attached to a surface MA of the metal layer M3. In the light-shielding layer LS, the metal layer M1 is located on a lower surface side (a side proximate to the light-emitting element LD), and the metal layer M3 is located on an upper surface side (a side proximate to the micro-lens ML).

In one example, the metal layers M1 and M3 are formed of a metal material containing titanium or molybdenum, and the metal layer M2 is formed of a metal material containing aluminum. The light-absorbing layer BL is, for example, a blackened film or an antireflection film in which thin films having different refractive indices are alternately stacked one another.

Thus, when the light-shielding layer LS is formed of a conductive material, undesired reflection of the external light transmitted through the micro-lens ML in the light-shielding layer LS can be suppressed.

Figure 11:
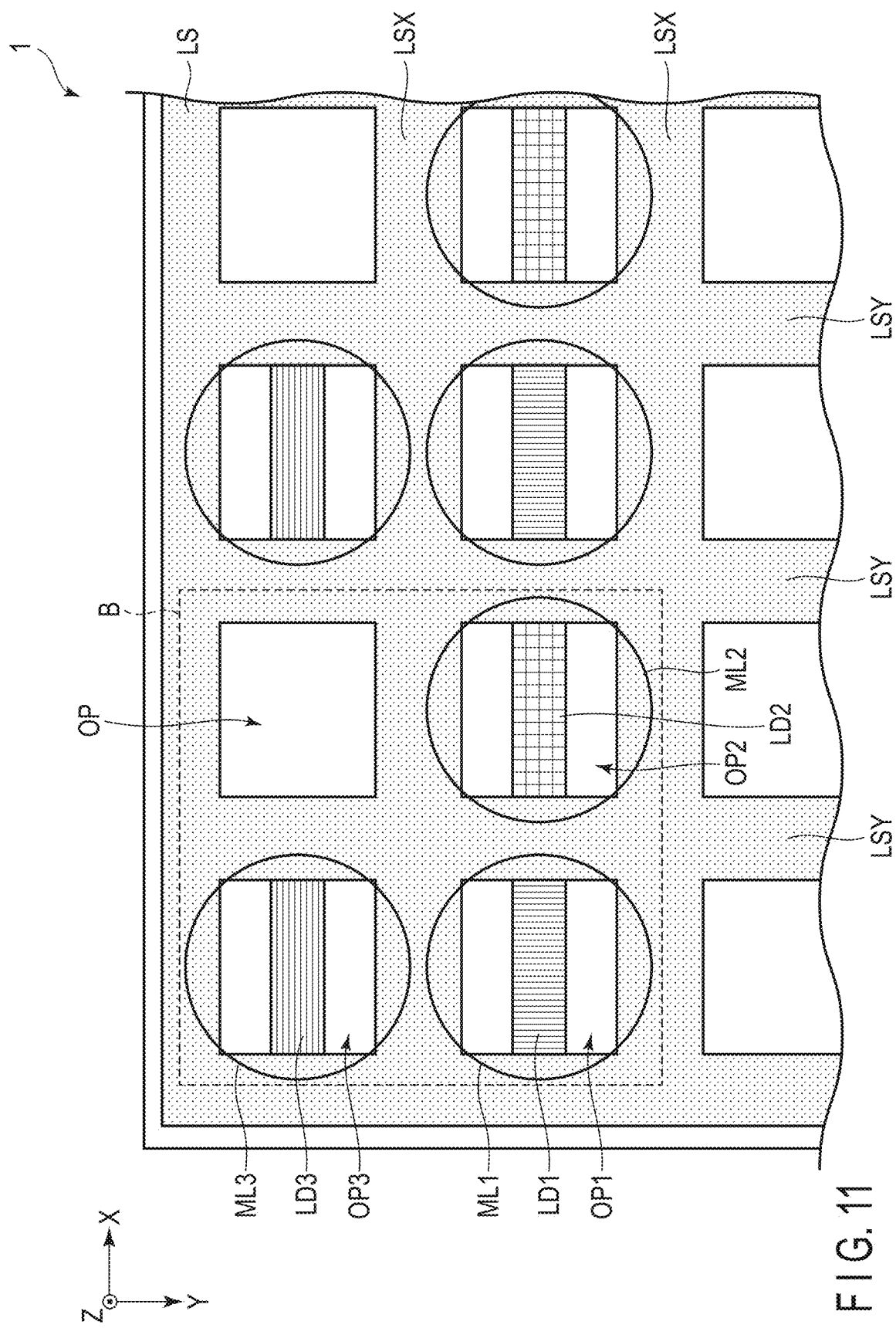
FIG. 11 is a plan view showing another configuration example of the optical device 1 shown in FIG. 1.

FIG. 11 is a plan view of another configuration example of the optical device 1 shown in FIG. 1.

The configuration example shown in FIG. 11 is different from that of FIG. 7 in that the light-emitting elements LD include light-emitting elements which emit light of colors different from each other.

That is, the optical device 1 includes a unit block B enclosed by a dotted line in the figure. The unit block B includes a first light-emitting element LD1, a second light-emitting element LD2 and a third light-emitting element LD3. The first light-emitting element LD1 is configured to emit light of a first color. The second light-emitting element LD2 is configured to emit light of a second color different from the first color. The third light-emitting element LD3 is configured to emit light of a third color different from the first and second colors. For example, the first color is green, the second color is blue, and the third color is red. Note that the combination of colors is not limited to that of this example. Further, the unit block B may further include a light-emitting element which emit light of some other color. In the unit block B, openings OP which do not overlap light-emitting elements may not be provided.

When the optical device 1 is a display device, the unit block B corresponds to a pixel, and the first light-emitting element LD1, the second light-emitting element LD2 and the third light-emitting element LD3 correspond to sub-pixels, respectively.

The light-shielding layer LS is formed into a lattice shape including a portion LSX and a portion LSY, and overlaps between adjacent light-emitting elements LD. The light-shielding layer LS includes a plurality of openings OP including the first opening OP1, the second opening OP2 and the third opening OP3. The first opening OP1 overlaps the first light-emitting element LD1, the second opening OP2 overlaps the second light-emitting element LD2 and the third opening OP3 overlaps the third light-emitting element LD3.

The micro-lenses ML including the first micro-lens ML1, the second micro-lens ML2 and the third micro-lens ML3 respectively overlap the openings OP and the light-emitting elements LD. The first micro-lens ML1 overlaps the first opening OP1 and the first light-emitting element LD1. The second micro-lens ML2 overlaps the second opening OP2 and the second light-emitting element LD2. The third micro-lens ML3 overlaps the third opening OP3 and the third light-emitting element LD3.

According to such a configuration example, the efficiency of light extraction of each color can be improved.

Next, the results in a simulation for efficiency of light extraction and front luminance of the normal direction of the optical device 1 will be explained.

Figure 12:
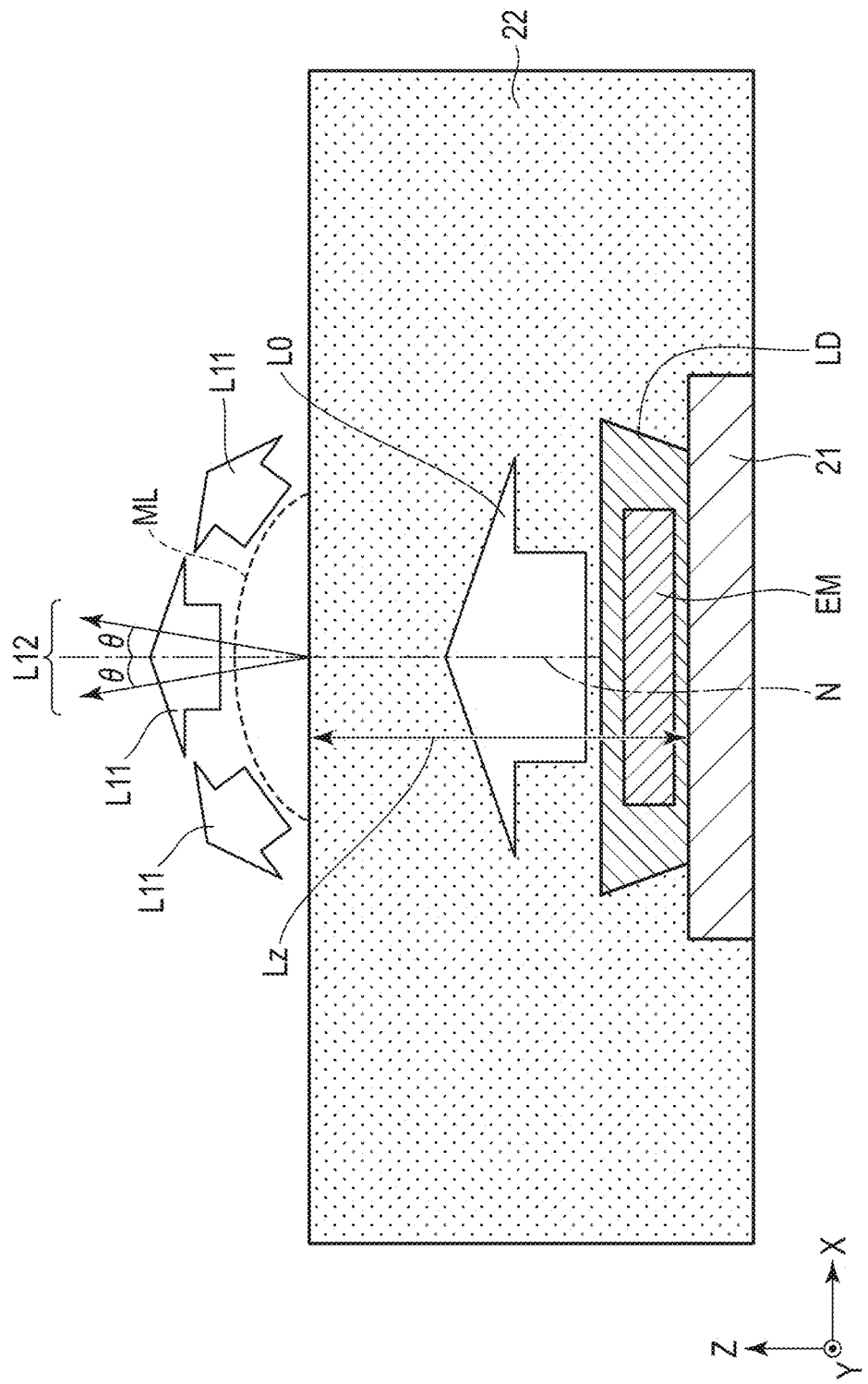
FIG. 12 is a diagram illustrating conditions of a simulation.

FIG. 12 is a diagram illustrating conditions for the simulation.

The conditions are as follows. The light-emitting device LD includes a light-emitting portion EM and is stacked on a pad 21. The light-emitting part EM is formed of gallium nitride (GaN). Here, it is assumed that various insulating films 22 between the light-emitting element LD and the micro-lens ML are uniform media having the same refractive index.

When the illuminance of light L0 emitted from the light-emitting element LD is set to IL0 and the illuminance of light L11 emitted from the insulating film 22 to the outside is set to IL11, the light extraction efficiency is defined as (IL11/IL0).

When the angle θ to the normal N of the light-emitting element LD is in a range of ±10°, the luminance of light L12 emitted from the insulating film 22 to the outside is defined as a front luminance.

The efficiency of light extraction and front luminance were calculated using the distance Lz along the third direction Z from the pad 21 to the micro-lens ML as a parameter.

Figure 13:
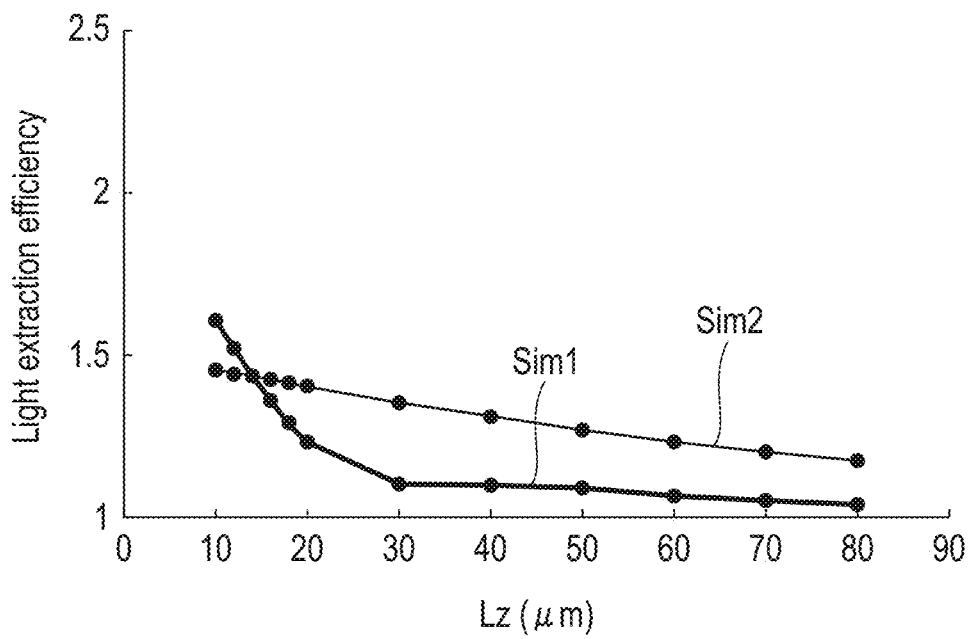
FIG. 13 is a diagram showing results of the simulation in efficiency of light extraction.

FIG. 13 is a diagram showing the results of a simulation for the efficiency of light extraction.

The horizontal axis indicates the distance Lz (μm) and the vertical axis indicates the efficiency of light extraction. Note that the light extraction efficiency is indicated as a relative value when the light extraction efficiency of the comparative example in which the micro-lens ML is not disposed on the insulating film 22 is set to 1.

Simulation result Sim1 in the figure indicates the simulation result of the light extraction efficiency obtained when one micro-lens ML overlaps one light-emitting element LD, as shown in FIG. 2 and the like.

Simulation result Sim2 in the figure indicates the simulation result of the light extraction efficiency obtained when multiple micro-lenses ML overlap one light-emitting element LD, as shown in FIG. 5.

In each of the simulation results Sim1 and Sim2, it has been confirmed that a light extraction efficiency higher than that of the comparative example can be obtained. Further, in each of the simulation results Sim1 and Sim2, it has been confirmed that the light extraction efficiency can be improved further as the distance Lz is smaller.

When the improvement of the light extraction efficiency is a priority, a smaller distance Lz is preferable. For example, it is preferable that the distance Lz be in a range of 10 μm to 30 μm.

Figure 14:
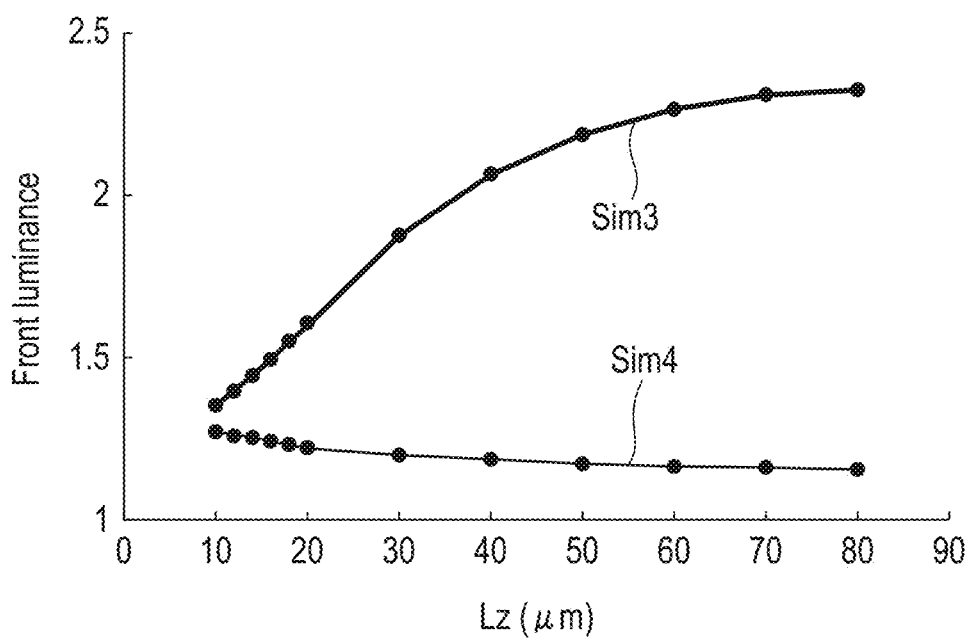
FIG. 14 is a diagram showing results of the simulation of front luminance.

FIG. 14 is a diagram showing the results of a simulation for the front luminance.

The horizontal axis indicates the distance Lz (μm) and the vertical axis indicates the front luminance. The front luminance is indicated as a relative value when the front luminance of the comparative example in which no micro-lens ML is disposed on the insulating film 22 is set to 1.

Simulation result Sim3 in the figure indicates the simulation results of the front luminance obtained when one micro-lens ML overlaps one light-emitting element LD as shown in FIG. 2 and the like.

Simulation result Sim4 in the figure indicates the simulation results of the front luminance obtained when multiple micro-lenses ML overlap one light-emitting element LD, as shown in FIG. 5.

In each of simulation results Sim3 and Sim4, it has been confirmed that a front luminance higher than that of the comparative example can be obtained. Further, when focusing on the simulation result Sim3, it has been confirmed that as the distance Lz is larger, the front luminance can be further improved. When focusing on the simulation result Sim4, it has been confirmed that the front luminance is substantially constant without depending on the distance Lz.

When the improvement of the front luminance is a priority, it is preferable to apply a configuration in which one micro-lens ML overlaps one light-emitting element LD. When the distance Lz is 25 μm or more, a front luminance twice or more that of the comparative example can be obtained. Here, focusing on the simulation result Sim3, if the distance Lz exceeds 70 μm, the front luminance tends to saturate. Therefore, for example, the distance Lz should preferably be set in a range of 20 μm to 70 μm, and more preferably, in a range of 40 μm to 60 μm.

As described above, according to this embodiment, it is possible to provide an optical device which can improve the light extraction efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical device comprising:
   a drive circuit board;
   a first light-emitting element and a second light-emitting element mounted on the drive circuit board;
   a first insulating film covering an entirety of the first light-emitting element and an entirety of the second light-emitting element;
   a light-shielding layer disposed to overlap a gap between the first light-emitting element and the second light-emitting element on the first insulating film, and including a first opening overlapping the first light-emitting element and a second opening overlapping the second light-emitting element;
   an overcoat layer covering the light-shielding layer;
   a first micro-lens disposed on the overcoat layer and overlapping the first opening; and
   a second micro-lens disposed on the overcoat layer and overlapping the second opening,
   wherein an edge of each of the first micro-lens and the second micro-lens overlaps the light-shielding layer,
   the first insulating film is a transparent organic film, and has a flat top surface overlapping the first light-emitting element and the second light-emitting element,
   a thickness of the first insulating film directly above the first light-emitting element and a thickness of the first insulating film directly above the second light-emitting element are smaller than a thickness of the first insulating film between the first light-emitting element and the second light-emitting element,
   the light-shielding layer is formed on the flat top surface, and
   the overcoat layer is in contact with the flat top surface.

2. The optical device of claim 1, wherein
   the light-shielding layer has a film thickness of 5 μm or less.

3. The optical device of claim 1, wherein
   the light-shielding layer has a film thickness of 10 μm or more.

4. The optical device of claim 1, wherein
   the light-shielding layer includes at least a first layer and a second layer between the first insulating film and the overcoat layer,
   the first layer is in contact with the first insulating film, and
   the second layer is covered by the overcoat layer.

5. The optical device of claim 1, further comprising:
   a spacer disposed on the overcoat layer; and
   a transparent cover member supported by the spacer and opposing the first micro-lens and the second micro-lens.

6. The optical device of claim 1, wherein
   the light-shielding layer is formed into a grid pattern in plan view.

7. The optical device of claim 6, wherein
   the first opening and the second opening are formed into a quadrangular shape.

8. The optical device of claim 6, wherein
   the first opening and the second opening are formed into a circular shape.

9. The optical device of claim 1, wherein
   the light-shielding layer is formed of a conductive material and is grounded.

10. The optical device of claim 9, wherein
    the light-shielding layer comprises a metal layer and a light-absorbing layer attached to a surface of the metal layer.

11. The optical device of claim 1, wherein
    the first light-emitting element and the second light-emitting element are configured to emit light of colors different from each other.

12. The optical device of claim 1, wherein
    a film thickness of the light-shielding layer is less than a thickness of the overcoat layer directly above the light-shielding layer.

13. The optical device of claim 1, wherein
    the first insulating film is thicker than the light-shielding layer.

14. An optical device comprising:
    a drive circuit board;
    a first light-emitting element and a second light-emitting element mounted on the drive circuit board;
    a first insulating film covering an entirety of the first light-emitting element and an entirety of the second light-emitting element;
    a light-shielding layer disposed to overlap a gap between the first light-emitting element and the second light-emitting element on the first insulating film and including a first opening overlapping the first light-emitting element and a second opening overlapping the second light-emitting element;
    an overcoat layer covering the light-shielding layer;
    a plurality of first micro-lenses disposed on the overcoat layer and overlapping the first opening; and
    a plurality of second micro-lenses disposed on the overcoat layer and overlapping the second opening, wherein
    the light-shielding layer is located between the plurality of first micro-lenses and the first insulating film, and between the plurality of second micro-lenses and the first insulating film,
    the first insulating film is a transparent organic film, and has a flat top surface overlapping the first light-emitting element and the second light-emitting element,
    a thickness of the first insulating film directly above the first light-emitting element and a thickness of the first insulating film directly above the second light-emitting element are smaller than a thickness of the first insulating film between the first light-emitting element and the second light-emitting element,
    the light-shielding layer is formed on the flat top surface, and
    the overcoat layer is in contact with the flat top surface.

15. The optical device of claim 14, wherein
    a film thickness of the light-shielding layer is less than a thickness of the overcoat layer directly above the light-shielding layer.

16. The optical device of claim 14, wherein
the first insulating film is thicker than the light-shielding layer.

17. An optical device comprising:
a drive circuit board;
a first light-emitting element and a second light-emitting element mounted on the drive circuit board;
a first insulating film covering an entirety of the first light-emitting element and an entirety of the second light-emitting element;
a light-shielding layer disposed to overlap a gap between the first light-emitting element and the second light-emitting element on the first insulating film, and including a first opening overlapping the first light-emitting element and a second opening overlapping the second light-emitting element;
an overcoat layer covering the light-shielding layer; and
a single micro-lens disposed on the overcoat layer and overlapping over the first opening and the second opening, wherein
the single micro-lens is in contact with the overcoat layer,
the first insulating film is a transparent organic film, and has a flat top surface overlapping the first light-emitting element and the second light-emitting element,
a thickness of the first insulating film directly above the first light-emitting element and a thickness of the first insulating film directly above the second light-emitting element are smaller than a thickness of the first insulating film between the first light-emitting element and the second light-emitting element,
the light-shielding layer is formed on the flat top surface, and
the overcoat layer is in contact with the flat top surface.

18. The optical device of claim 17, wherein
a film thickness of the light-shielding layer is less than a thickness of the overcoat layer directly above the light-shielding layer.

19. The optical device of claim 17, wherein
the first insulating film is thicker than the light-shielding layer.

* * * * *